US011197389B2

(12) United States Patent
Lin

(10) Patent No.: US 11,197,389 B2
(45) Date of Patent: Dec. 7, 2021

(54) SERVER CHASSIS

(71) Applicant: Super Micro Computer Inc., San Jose, CA (US)

(72) Inventor: Ken-Sheng Lin, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 43 days.

(21) Appl. No.: 16/841,449

(22) Filed: Apr. 6, 2020

(65) Prior Publication Data

US 2021/0315125 A1 Oct. 7, 2021

(51) Int. Cl.
*H05K 7/14* (2006.01)
*A47B 88/437* (2017.01)
*A47B 88/487* (2017.01)

(52) U.S. Cl.
CPC ......... *H05K 7/1489* (2013.01); *A47B 88/437* (2017.01); *A47B 88/487* (2017.01); *A47B 2210/0008* (2013.01); *A47B 2210/0018* (2013.01); *A47B 2210/0035* (2013.01)

(58) Field of Classification Search
CPC .. H05K 7/1489; A47B 88/437; A47B 88/487; A47B 2210/0008; A47B 2210/0035; A47B 2210/0018
See application file for complete search history.

(56) References Cited

U.S. PATENT DOCUMENTS

| | | | | |
|---|---|---|---|---|
| 3,912,341 A * | 10/1975 | Stein | ..................... | A47B 88/493 384/18 |
| 9,609,778 B1 * | 3/2017 | Spencer | ............... | H05K 7/1489 |
| 9,673,567 B1 * | 6/2017 | Braylovskiy | ........ | H01R 13/447 |
| 10,136,547 B1 * | 11/2018 | Cecire | ................... | H05K 7/1489 |
| 10,563,429 B1 * | 2/2020 | Bailey | ..................... | E05B 65/46 |
| 10,638,634 B1 * | 4/2020 | Elsasser | ............... | H05K 9/0062 |
| 10,765,028 B1 * | 9/2020 | Beall | ..................... | A47B 88/919 |
| 10,806,256 B1 * | 10/2020 | Chen | ..................... | H05K 7/183 |
| 10,834,842 B1 * | 11/2020 | Elsasser | ............... | H05K 7/1489 |
| 10,840,643 B1 * | 11/2020 | Jin | ........................ | H05K 7/1492 |
| 11,009,069 B1 * | 5/2021 | Chen | ...................... | A47B 88/49 |
| 2003/0002261 A1 * | 1/2003 | Berry | ................... | H05K 7/1489 361/727 |
| 2004/0227442 A1 * | 11/2004 | Huang | ................. | A47B 88/487 312/334.9 |

(Continued)

FOREIGN PATENT DOCUMENTS

CN 112312717 A * 2/2021
CN 112512259 A * 3/2021

(Continued)

*Primary Examiner* — Hanh V Tran
(74) *Attorney, Agent, or Firm* — Chun-Ming Shih; HDLS IPR Services

(57) ABSTRACT

A server chassis includes an outer case including a plurality of outer shells and an insertion space. The outer shell has an inner wall, and an outer rail structure is disposed on the inner wall of the outer shell. The outer rail structures including an outer rail-plate, an outer-rail and a set of ball slide rail. A chassis body is slidably coupled to the insertion space. The chassis body includes inner shells and an accommodating space. An inner rail structure includes an inner rail-plate, and the chassis body is capable of sliding with respect to the outer case through the inner rail-plate inserted in the outer-rail.

7 Claims, 17 Drawing Sheets

(56) References Cited

U.S. PATENT DOCUMENTS

| | | | | |
|---|---|---|---|---|
| 2012/0182671 A1* | 7/2012 | Hou | .................... | H05K 7/1489 |
| | | | | 361/679.01 |
| 2015/0146372 A1* | 5/2015 | French, Jr. | ........... | H05K 7/1489 |
| | | | | 361/679.58 |
| 2016/0192529 A1* | 6/2016 | Butterbaugh | ........ | H05K 7/1487 |
| | | | | 361/679.57 |
| 2017/0290190 A1* | 10/2017 | Lindquist | ............. | H05K 7/1417 |
| 2018/0242472 A1* | 8/2018 | Wu | ..................... | H05K 7/1487 |
| 2019/0069431 A1* | 2/2019 | Kho | ................... | H05K 7/20172 |
| 2019/0183247 A1* | 6/2019 | Chen | .................... | A47B 47/024 |
| 2021/0050693 A1* | 2/2021 | Hung | .................... | H01R 13/73 |

FOREIGN PATENT DOCUMENTS

| | | | | | |
|---|---|---|---|---|---|
| EP | 3157313 | A2 * | 4/2017 | ............. | H05K 7/183 |
| EP | 3493661 | A1 * | 6/2019 | ........... | H05K 7/1489 |
| JP | 6263652 | B2 * | 1/2018 | ........... | H05K 7/1489 |

\* cited by examiner a server chassis.

SERVER CHASSIS

BACKGROUND OF THE INVENTION

Field of the Invention

The present invention generally relates to a server and, in particular to a server chassis.

Description of Prior Art

For requirements of accessing a large amount of electronic data, currently servers are mostly provided with multiple chassis stacked in a cabinet; moreover, each chassis is accommodated with a motherboard, power supply modules, and a plurality of data storage units arranged in arrays.

However, the aforementioned servers have considerable weight after loading multiple data storage units inside the chassis, so that the chassis and the inner wall of the cabinet need to be connected by slide rails to facilitate moving of the chassis and extracting the data storage units. Moreover, the current slide rail structure is usually a three-section slide rail composed of an outer slide rail, a first slide bushing, a middle slide rail, a second slide bushing, and an inner slide rail etc. Although the three-section slide rail has a good supporting, its overall configurations take up more internal space inside the cabinet; thus, it results in a reduction in the number of layers stacked inside the cabinet and that does not satisfy the demands of using.

In view of the above drawbacks, the Inventor proposes the present invention based on his expert knowledge and elaborate researches in order to solve the problems of prior art.

SUMMARY OF THE INVENTION

Accordingly, an object of the present invention is to provide a server chassis to reduce the occupation space of the rails for disposing more data storage units.

In order to achieve the object mentioned above, the present invention provides a server chassis for combining with a cabinet comprising an outer case, a pair of outer rail structures, a chassis body and a pair of inner rail structures. The outer case includes a plurality of outer shells and an insertion space enclosed by the outer shells, and each of the outer shells has an inner wall facing the insertion space. The pair of outer rail structures are disposed on the inner wall at opposite sides of the outer shells correspondingly; each of the outer rail structures includes an outer rail-plate, a pair of outer-rails formed at two sides of the outer rail-plate and a set of ball slide rail. The set of ball slide rail is a single-layer slide rail composed of a plurality of balls and extended from one end of the outer-rail to the other end. The chassis body is slidably coupled to the insertion space. The chassis body includes a plurality of inner shells and an accommodating space enclosed by the inner shells, and each of the inner shells has an outer wall at a place away from the accommodation space. The pair of inner rail structures are disposed on the outer wall at opposite sides of the inner shells correspondingly; each of the inner rail structures includes an inner rail-plate, and the chassis body is capable of sliding with respect to the outer case through the inner rail-plate inserted in the outer-rail correspondingly.

Comparing to the prior art, the server chassis of the present invention has the outer rail structure disposed on the inner wall of the outer case and the inner rail structure arranged on the outer wall of the chassis body. Thus, the chassis body can be combined with the outer case, and the chassis body is slidably moved with respect to the outer case through the inner rail-plate inserted in the outer-rail correspondingly. Therefore, the rail structures are thinned for reducing their occupied space, so that more data storage units can be stored in the cabinet, and the practicality of the present invention is enhanced.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 3:
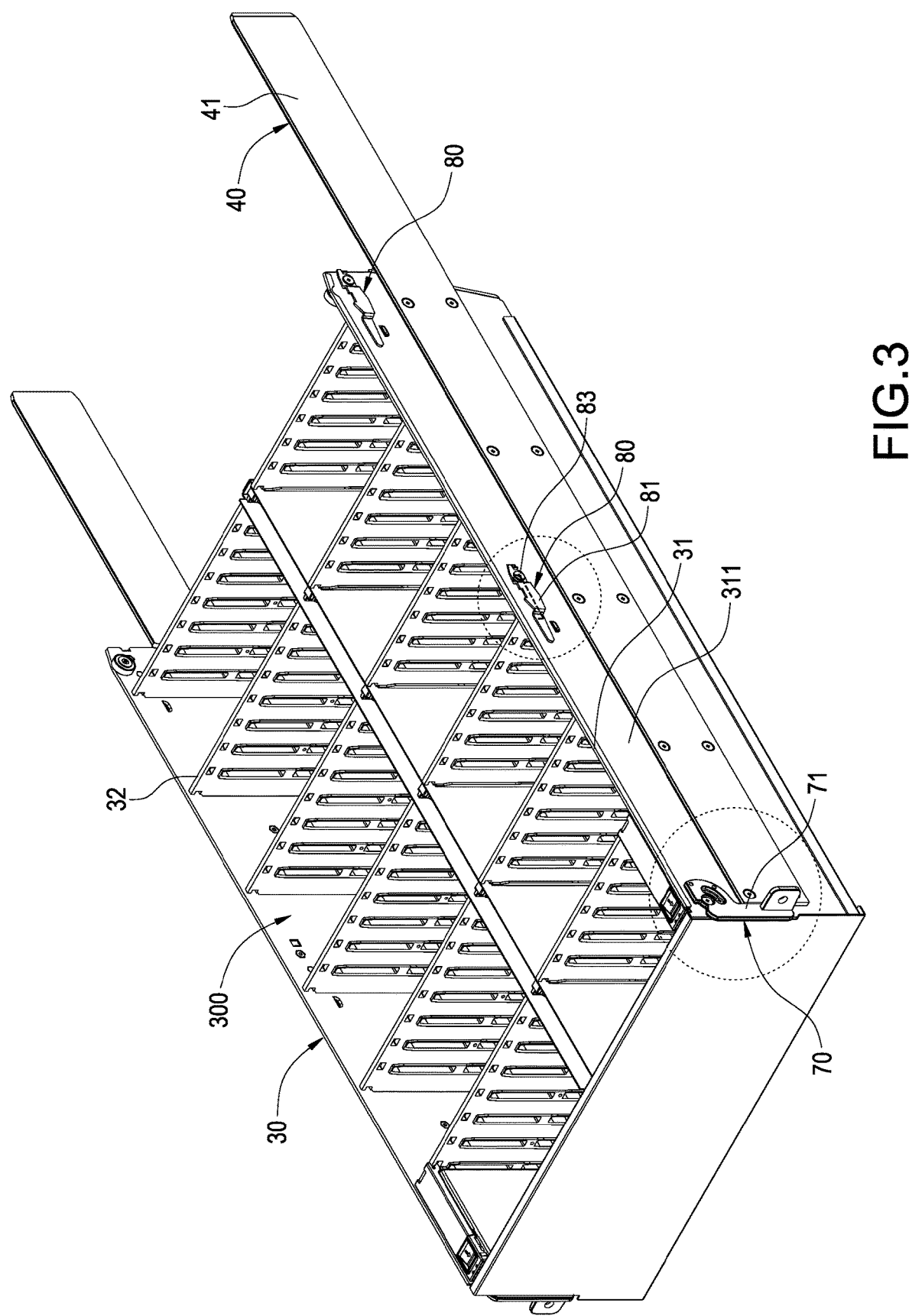
FIG. 3 is a perspective schematic view of the chassis body combined with the inner rail structure of the present invention.

Please refer to FIG. 1 to FIG. 3, FIG. 3A and FIG. 3B, which depict a perspective schematic view of the server chassis of the present invention, a perspective schematic view of the outer case combined with the outer rail structure of the present invention, a perspective schematic view of the chassis body combined with the inner rail structure of the present invention, and two partial enlarged schematic views of the FIG. 3. The present invention is a server chassis 1 for combining with a cabinet 2. The server chassis 1 comprises an outer case 10, a pair of outer rail structures 20, a chassis body 30 and a pair of inner rail structures 40. The outer case 10 is combined with the pair of outer rail structures 20 and fixed in the cabinet 2. The chassis body 30 is combined with the pair of inner rail structures 40 and movably combined in the outer case 10. The structure of the server chassis 1 is described in more detail as follows.

The outer case 10 includes a plurality of outer shells 11 and an insertion space 100 enclosed by the outer shells 11, and each of the outer shells 11 has an inner wall 111 facing the insertion space 100. Moreover, the outer case 10 further includes a stopper 12, and the stopper 12 is disposed at the inner wall of the outer shell 11. It should be noted that, in the present embodiment, the load capacity of the outer case 10 is about 120 kg, but it is not limited in actual implementation.

The pair of outer rail structures 20 are disposed on the inner walls at opposite sides of the outer shells 11 correspondingly. Each of the outer rail structures 20 includes an outer rail-plate 21, a pair of outer-rails 22 formed at two sides of the outer rail-plate 21 and a set of ball slide rail 23. In the present embodiment, the outer rail structure 20 is configured in a U shape. Besides, the set of ball slide rail 23 is a single-layer slide rail composed of a plurality of balls and extended from one end of the outer-rail 22 to the other end.

The chassis body 30 is slidably coupled to the insertion space 100. The chassis body 30 includes a plurality of inner shells 31 and an accommodating space 300 enclosed by the inner shells 31. Each of the inner shells 31 has an outer wall 311 at a place away from the accommodation space 300.

Moreover, the pair of inner rail structures 40 are disposed on the outer walls 311 at opposite sides of the inner shells 311 correspondingly. Each of the inner rail structures 40 includes an inner rail-plate 41, and the chassis body 30 is capable of sliding with respect to the outer case 10 through the inner rail-plate 41 inserted in the outer-rail 22 correspondingly. Thereby, the chassis body 30 is combined in the outer case 10.

It should be noted that, in this embodiment, an extraction length of the chassis body 30 is about 700 mm; besides, the load capacity of the chassis body 30 is about 120 kg, but it is not limited in actual implementation. Moreover, the server chassis 1 further includes a supporting roller 60. The supporting roller 60 is abutted a side of the inner rail-plate 41.

In one embodiment of the present invention, the server chassis 1 further includes a pair of handle structures 70. The pair of the handle structures 70 are disposed at opposite sides of the chassis body 30.

Figure 3A:
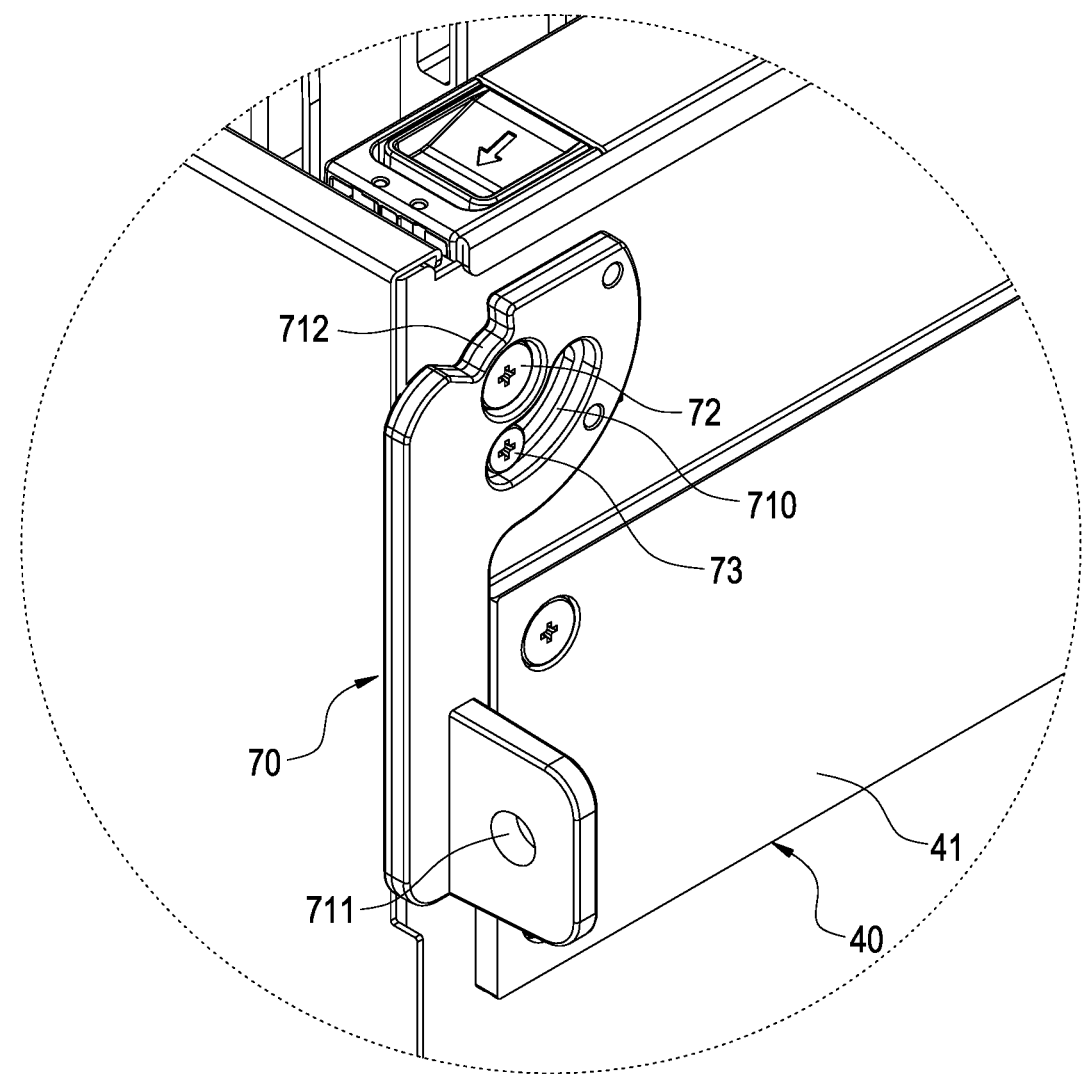
FIG. 3A and FIG. 3B are partial enlarged schematic views of the FIG. 3.

Specifically, as shown in FIG. 3 and FIG. 3A, each of the handle structures 70 includes a handle 71, a pivot 72 and a restricting member 73; the handle 71 is fixed on the outer wall 311 of the inner shell 31 through the pivot 72. In addition, the handle 71 has a limiting slot 710, and the restricting member 73 is arranged in the limiting slot 710.

Figure 1:
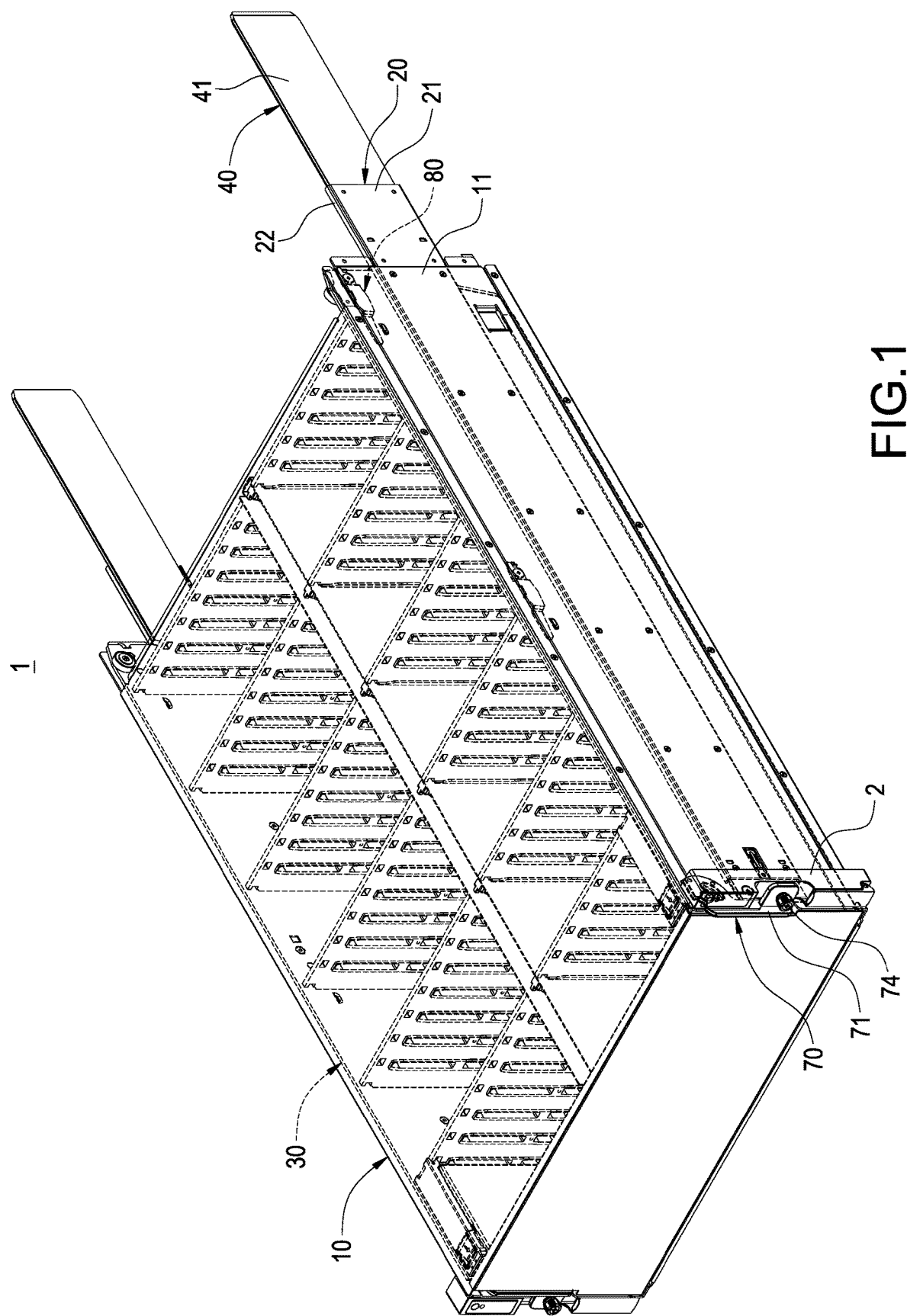
FIG. 1 is a perspective schematic view of the server chassis of the present invention.
Figure 2:
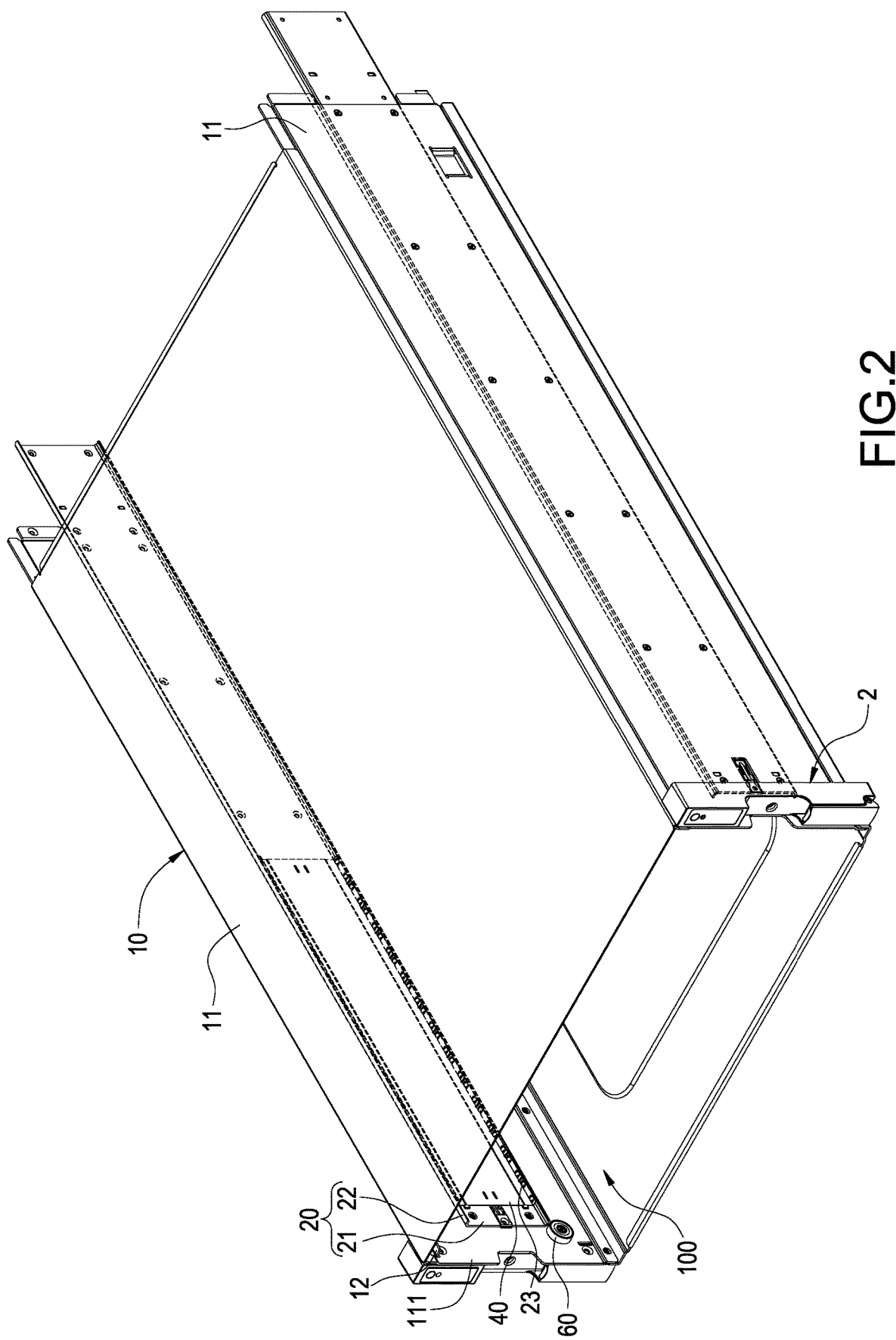
FIG. 2 is a perspective schematic view of the outer case combined with the outer rail structure of the present invention.

In more detail, each of the handle structures 70 further includes a fastener 74 (refer to FIG. 1). The handle 71 has a fastening hole 711, and the fastener 74 is inserted in the fastening hole 711 for holding the handle 71; besides, the handle 71 has a positioning slot 712 at one side thereof. When the chassis body 30 is completely inserted in the outer case 10, the stopper 12 abuts against one side of the positioning slot 712. At this time, the chassis body 30 cannot be moved because the handle 71 is blocked.

It is worthy to note that, in the present embodiment, the server chassis 1 further includes a plurality of positioning components 80. The positioning components 80 are disposed at the outer wall 311 of the inner shell 31 and are optionally blocked by the stopper 12. The purpose of positioning the chassis body 30 in multi segments will be achieved by the disposition of the positioning components 80.

Figure 3B:
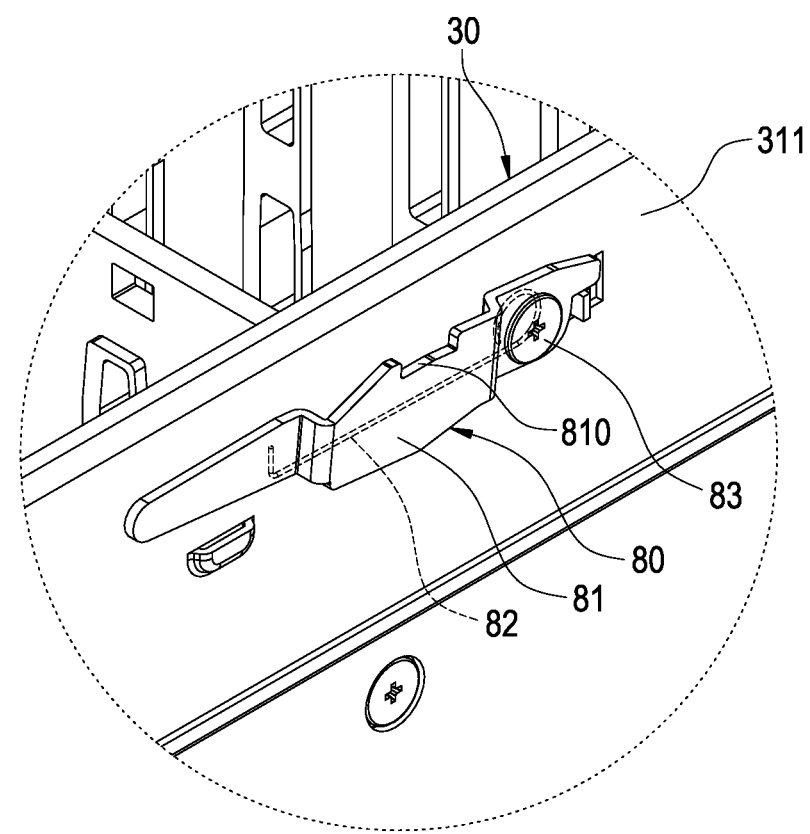

Further, please refer to FIG. 3B, each of the positioning components 80 includes a blocking arm 81, an elastic member 82, and a pivot shaft 83 sleeved with the elastic member 82. Besides, one end of the blocking arm 81 is coupled to the outer wall 311 of the inner shell 31 through the pivot shaft 83, and the blocking arm 81 is provided with a buckle slot 810 which can be locked by the stopper 12. For example, the elastic member 82 is a spring; thus, the blocking arm 81 can return to its original position through the elastic restoring force of the elastic member 82 after moving under an external force.

Figure 4:
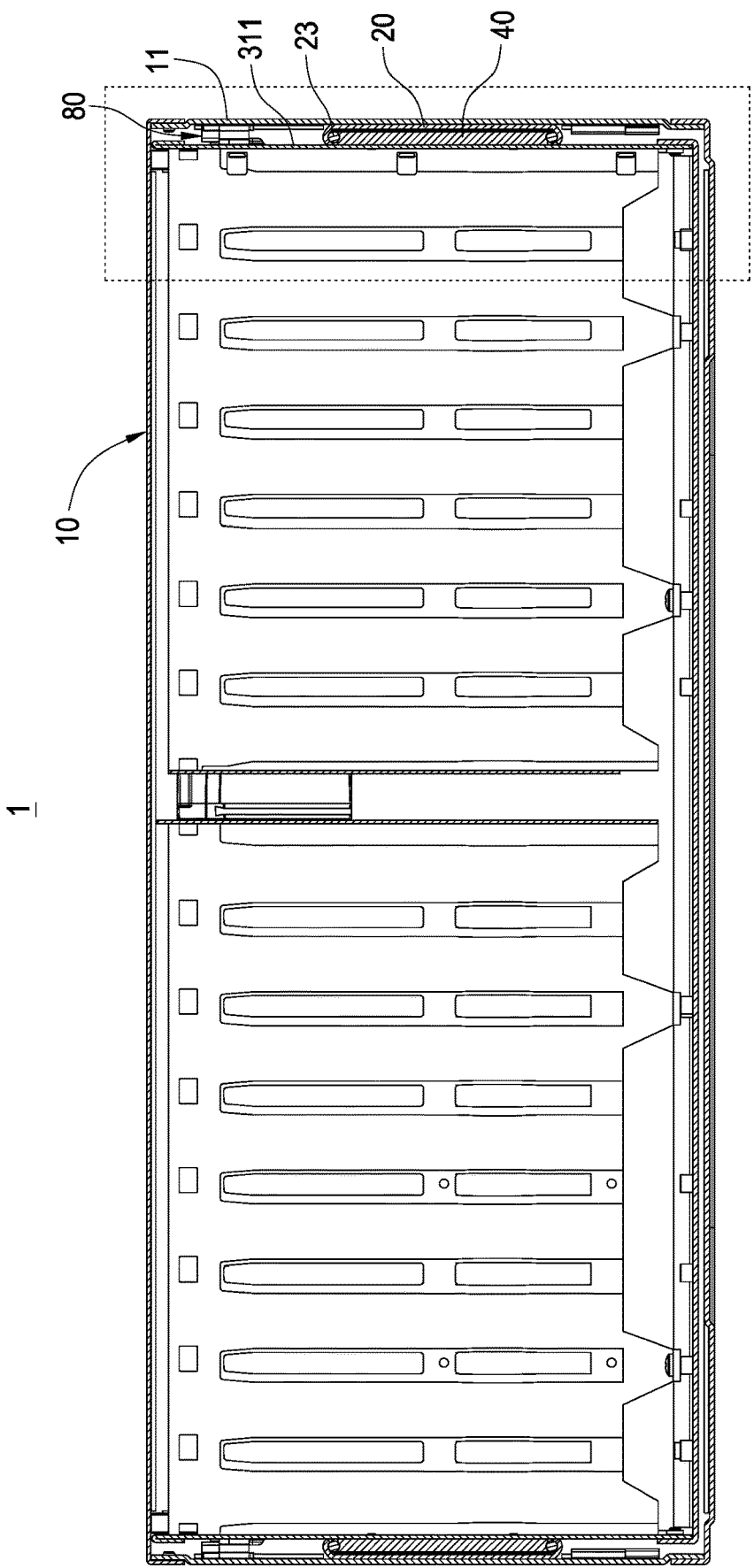
FIG. 4 is a cross sectional schematic view of the server chassis of the present invention.
Figure 5:
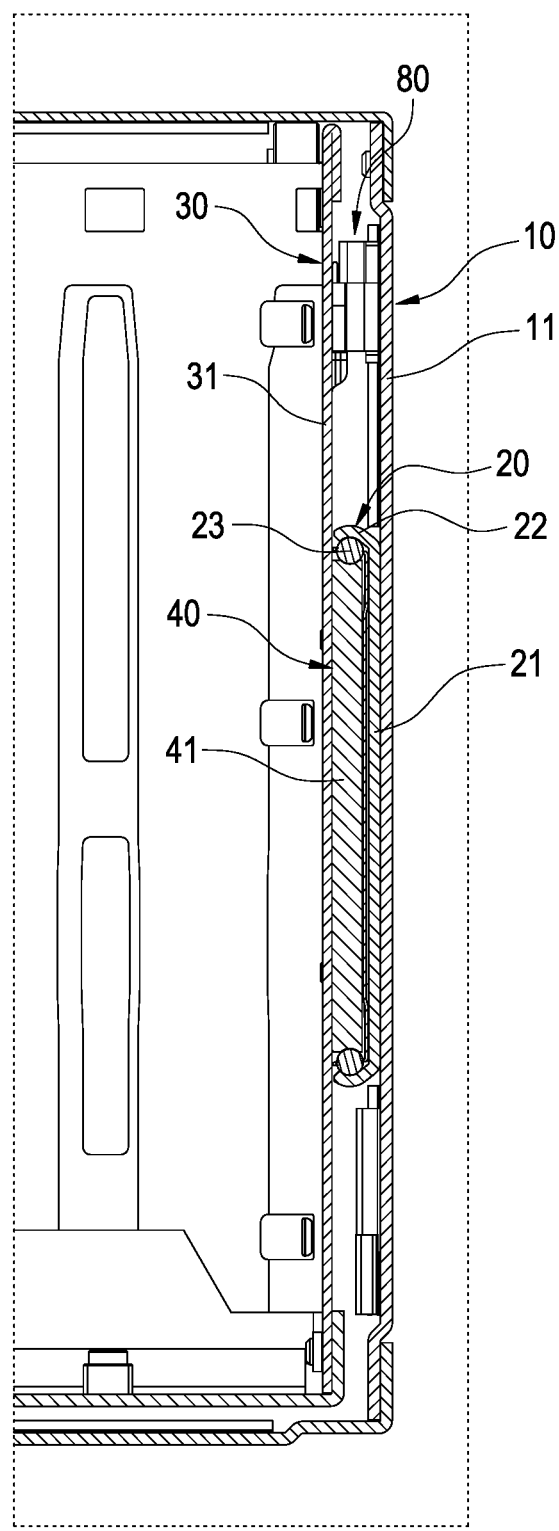
FIG. 5 is a partial enlarged schematic view of the FIG. 4.

Please also refer to FIG. 4 and FIG. 5, which depict a cross sectional schematic view of the server chassis of the present invention and a partial enlarged schematic view of the FIG. 4. As shown in the figures, the outer rail structures 20 are disposed on the inner walls at opposite sides of the outer shells 11 correspondingly, and the outer rail structure 20 is configured in a U shape. The inner rail structures 40 are disposed on the outer walls 311 at opposite sides of the inner shells 31 correspondingly, and the ball slide rail 23 is disposed between the outer rail-plate 21 and the inner rail-plate 41. Therefore, the chassis body 30 is capable of sliding with respect to the outer case 10 through the inner rail-plate 41 inserted in the outer-rail 22 correspondingly. Thereby, the chassis body 30 is combined in the outer case 10.

Figure 6:
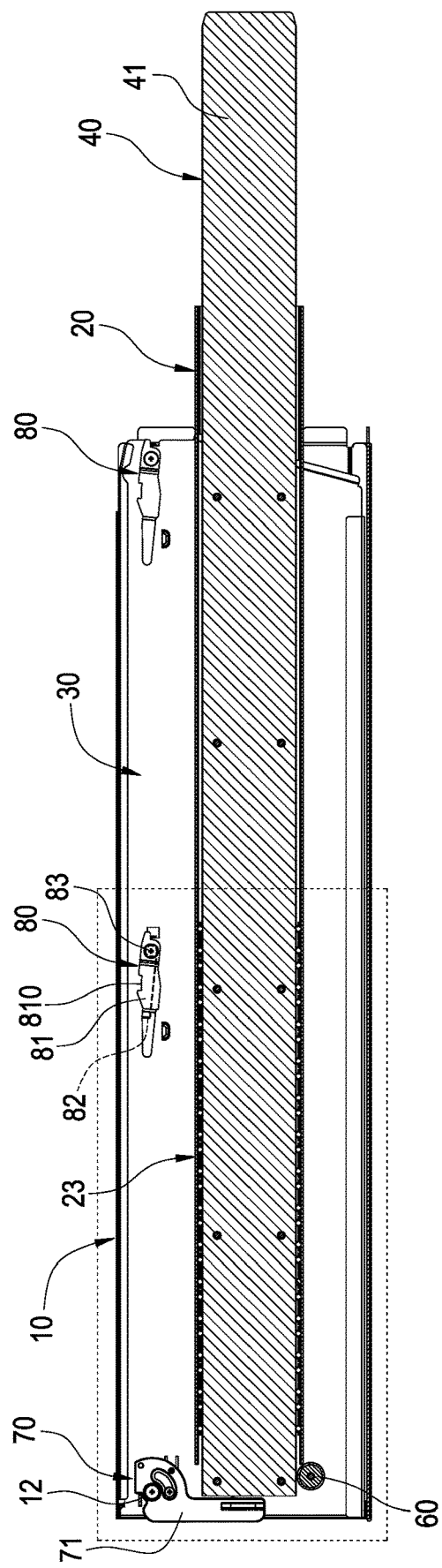
FIG. 6 is a cross sectional view of another side of the server chassis of the present invention.
Figure 7:
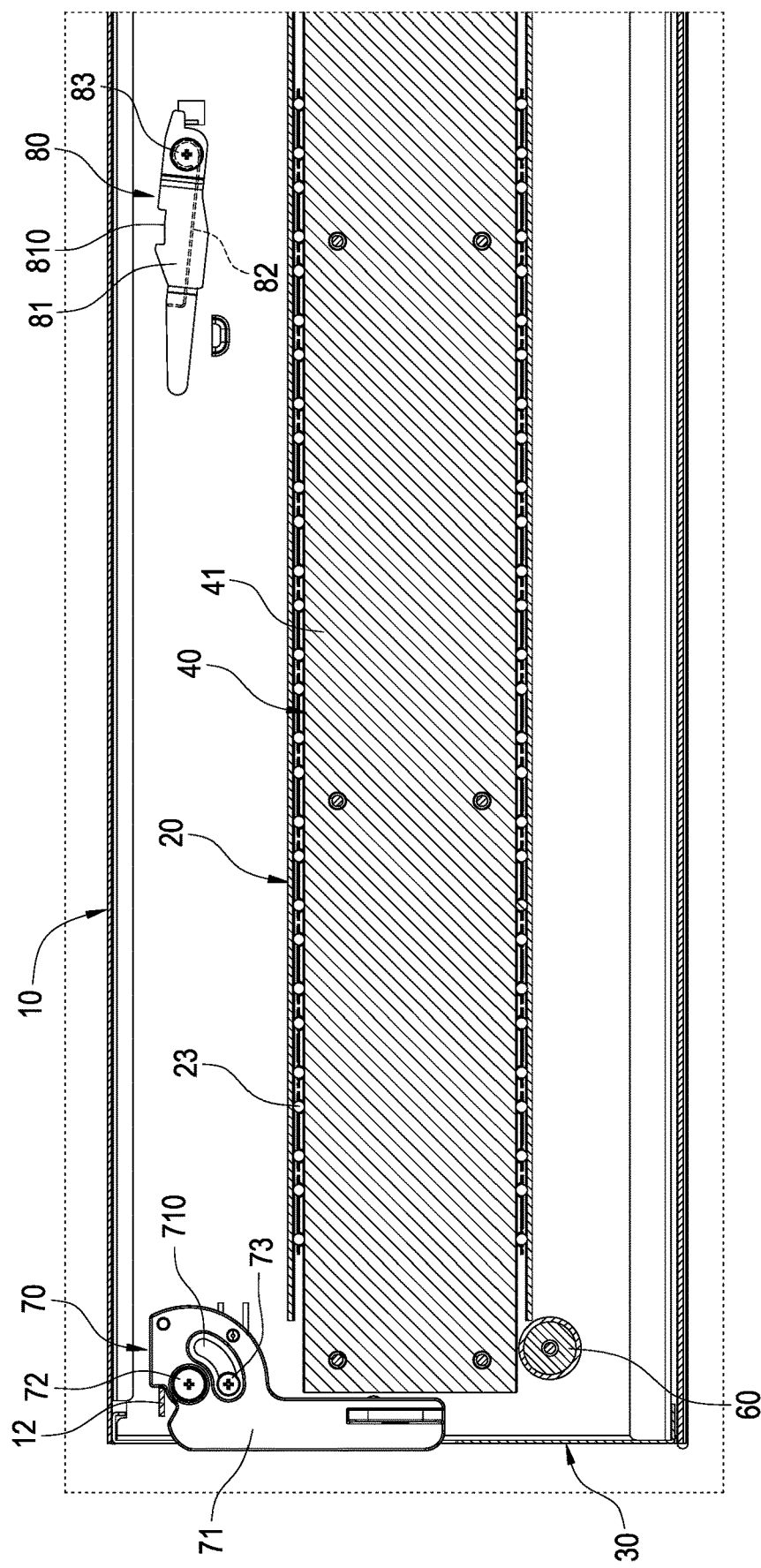
FIG. 7 is a partial enlarged schematic view of the FIG. 6.
Figure 8:
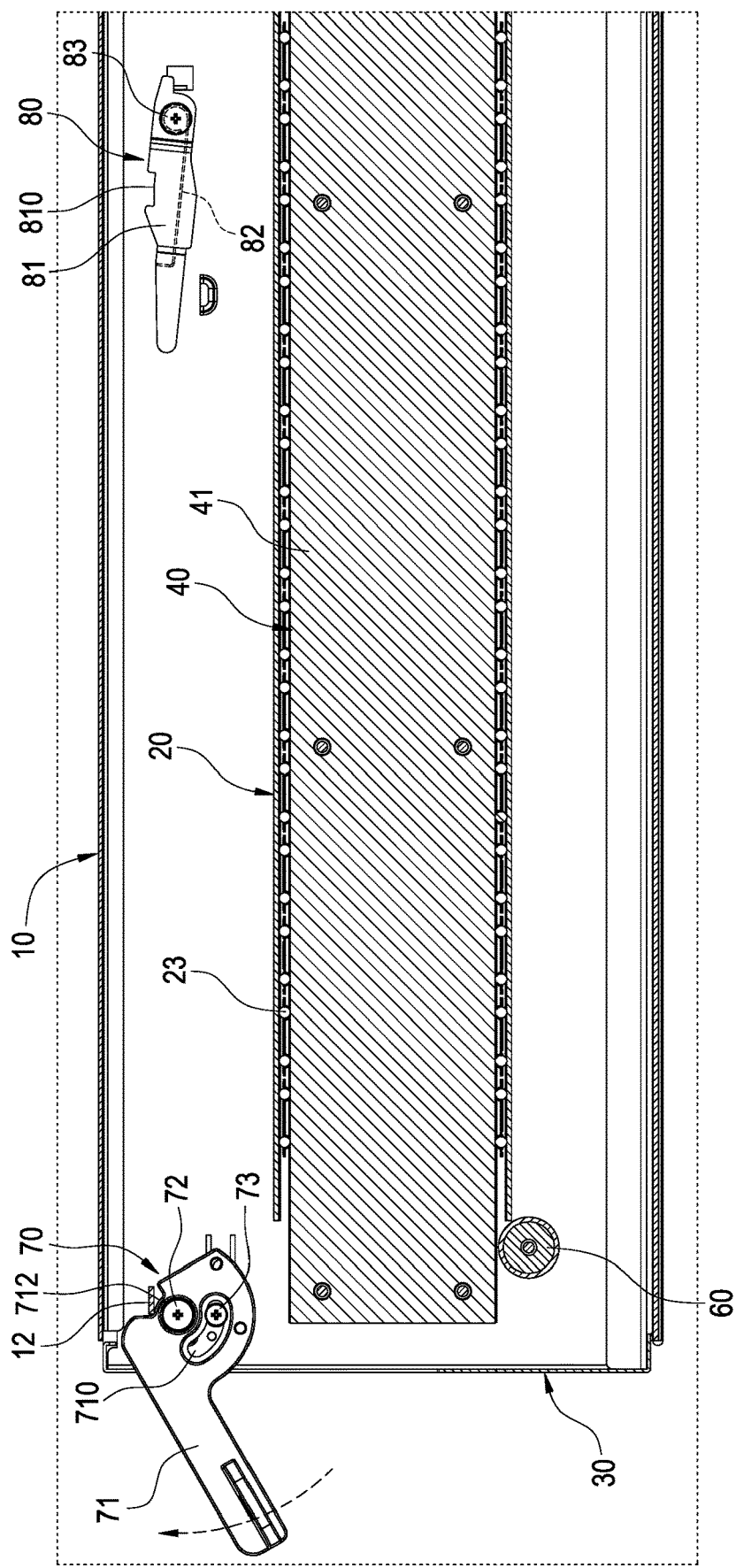
FIG. 8 is a schematic view of rotating the handle structure of the present invention.
Figure 9:
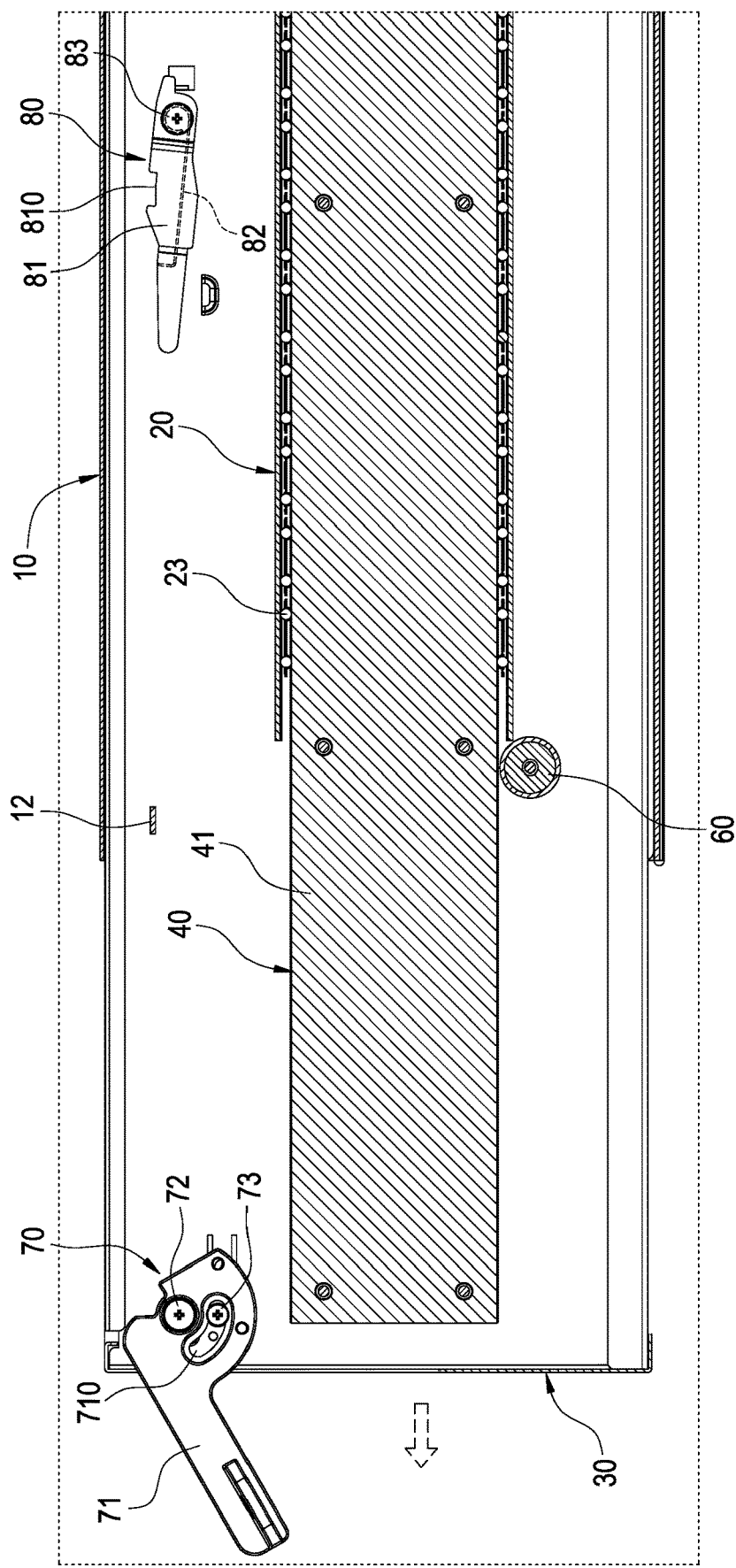
FIG. 9 is a schematic view of extracting the chassis body of the present invention.

Please refer to FIG. 6 and FIG. 7, which are a cross-sectional view and a partial enlarged view of another side of the server chassis of the present invention. As shown, the inner rail-plate 41 is inserted in the outer-rail 22 of the outer rail structure 20 (refer to FIG. 5), and the supporting roller 60 supports a side of the inner rail-plate 41. The stopper 12 abuts a side of the positioning slot 712 of the handle 71.

Please refer to FIG. 8 to FIG. 11, which depict a schematic view of rotating the handle structure of the present invention, a schematic view of extracting of chassis body of the present invention, a schematic view of positioning the chassis body in multi segments of the present invention, and a schematic view of operation of the positioning component of the present invention. When a user wants to remove the chassis body 30 from the outer case 10, an external force is applied to the handle 71, and thus the handle 71 rotates around the pivot 72; besides, the rotation angle of the handle 71 is limited by the restricting member 73 to be moved along the limiting slot 710 at a certain angle. Furthermore, it should be noted that, the positioning slot 712 can be released from the blocking of the stopper 12 when the handle 71 is rotated to a certain angle. At this time, the chassis body 30 can be moved relative to the outer case 10. Thereby, the user can hold the handle 71 to move the chassis body 30 out of the outer case 10.

Figure 10:
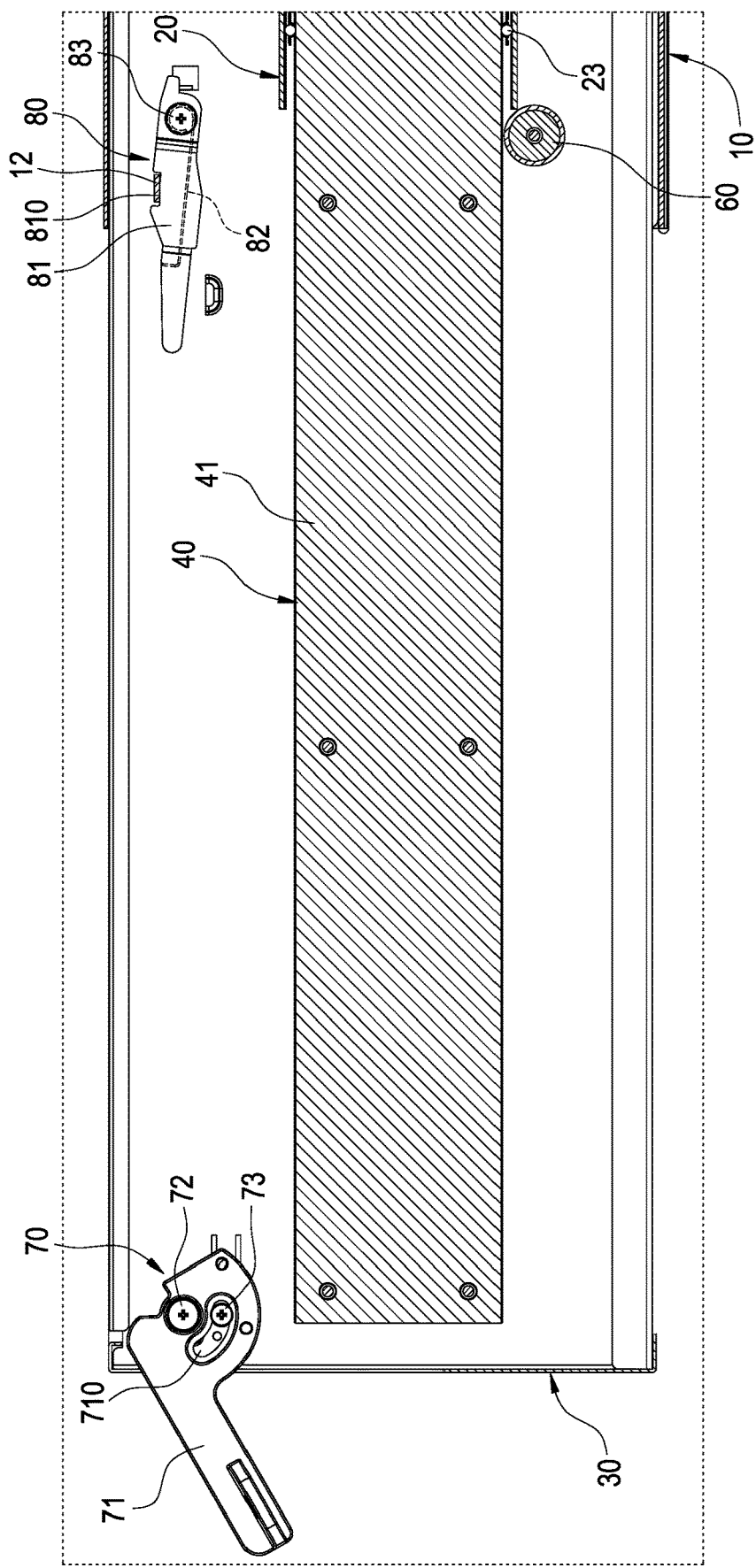
FIG. 10 is a schematic view of positioning the chassis body in multi segments of the present invention.

Please further refer to FIG. 10. The server chassis 1 of the present invention has disposed a plurality of positioning components 80. In the process of moving the chassis body 30 out of the outer case 10, the chassis body 30 can be positioned through being locked by one of the positioning components 80. That is, the stopper 12 (refer also to FIG. 1) on the outer shell 11 will be locked in the buckle slot 810 of one of the blocking arm 81 to position the chassis body 30.

Figure 11:
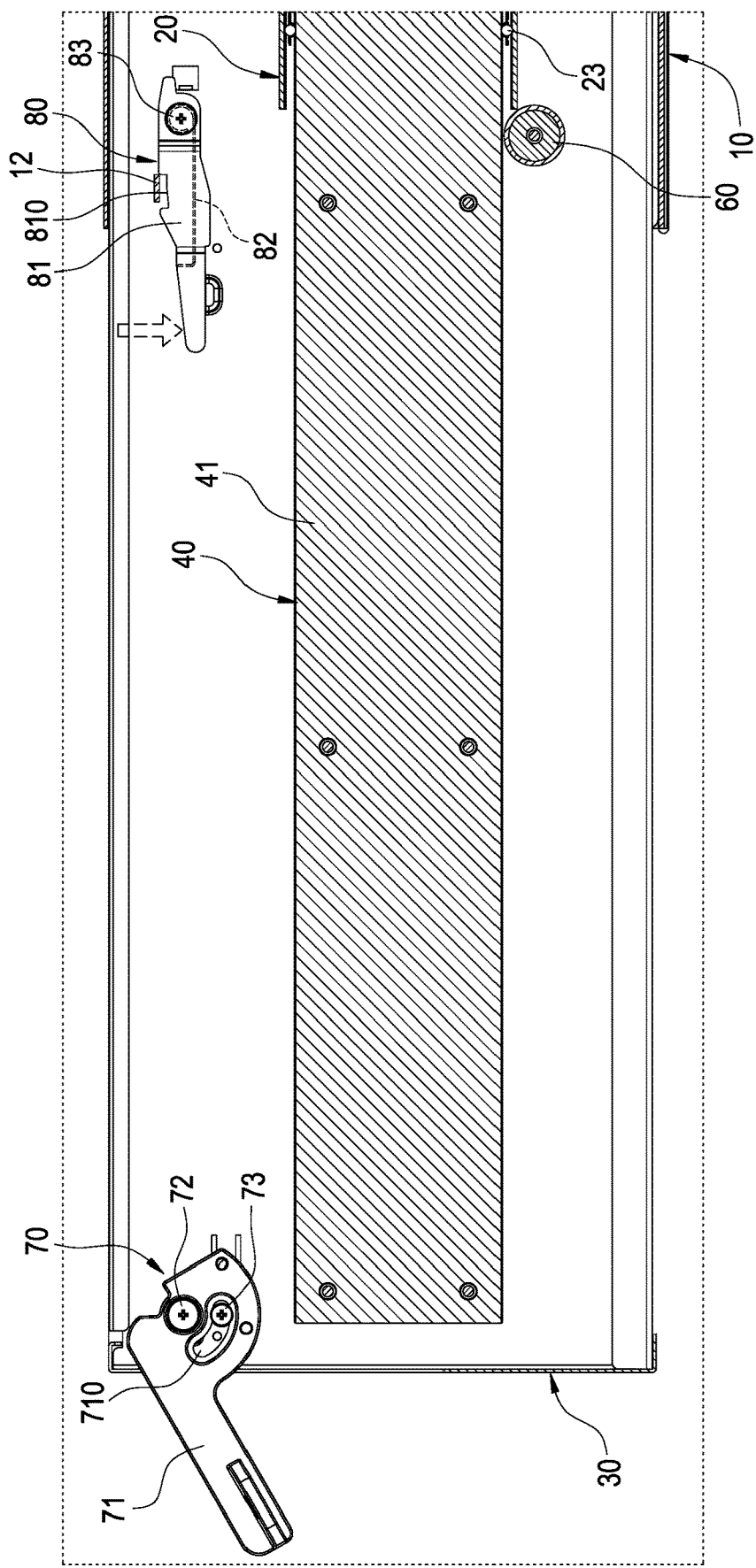
FIG. 11 is a schematic view of operation of the positioning component of the present invention.

Furthermore, as shown in FIG. 11, in the present embodiment, users can release the buckle slot 810 from the blocking of the stopper 12 by pressing one end of the blocking arm 81. Thus, the chassis body 30 can continue to move out of the outer case 10.

Figure 12:
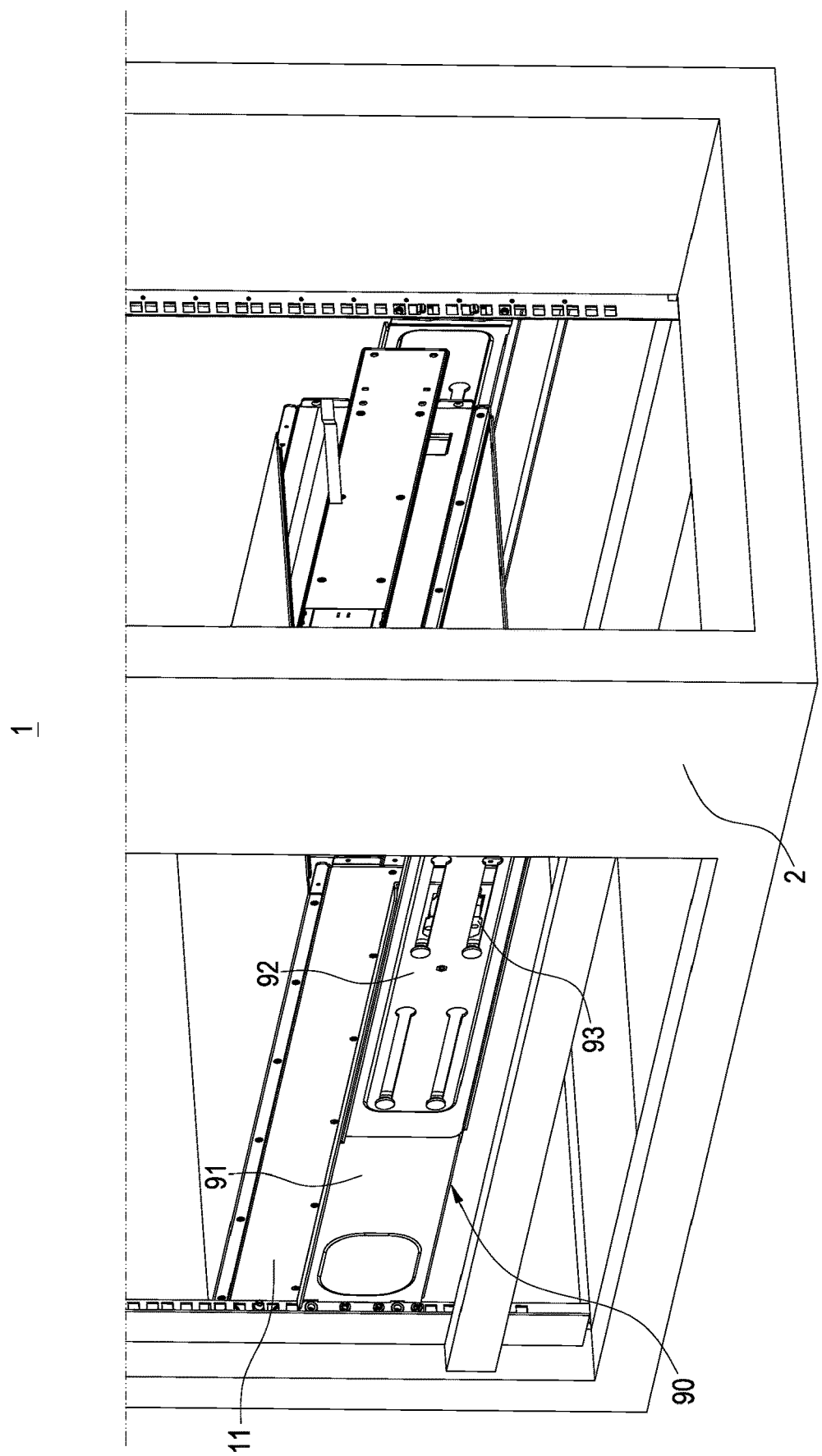
FIG. 12 and FIG. 13 are schematic views of application of the server chassis of the present invention.
Figure 13:
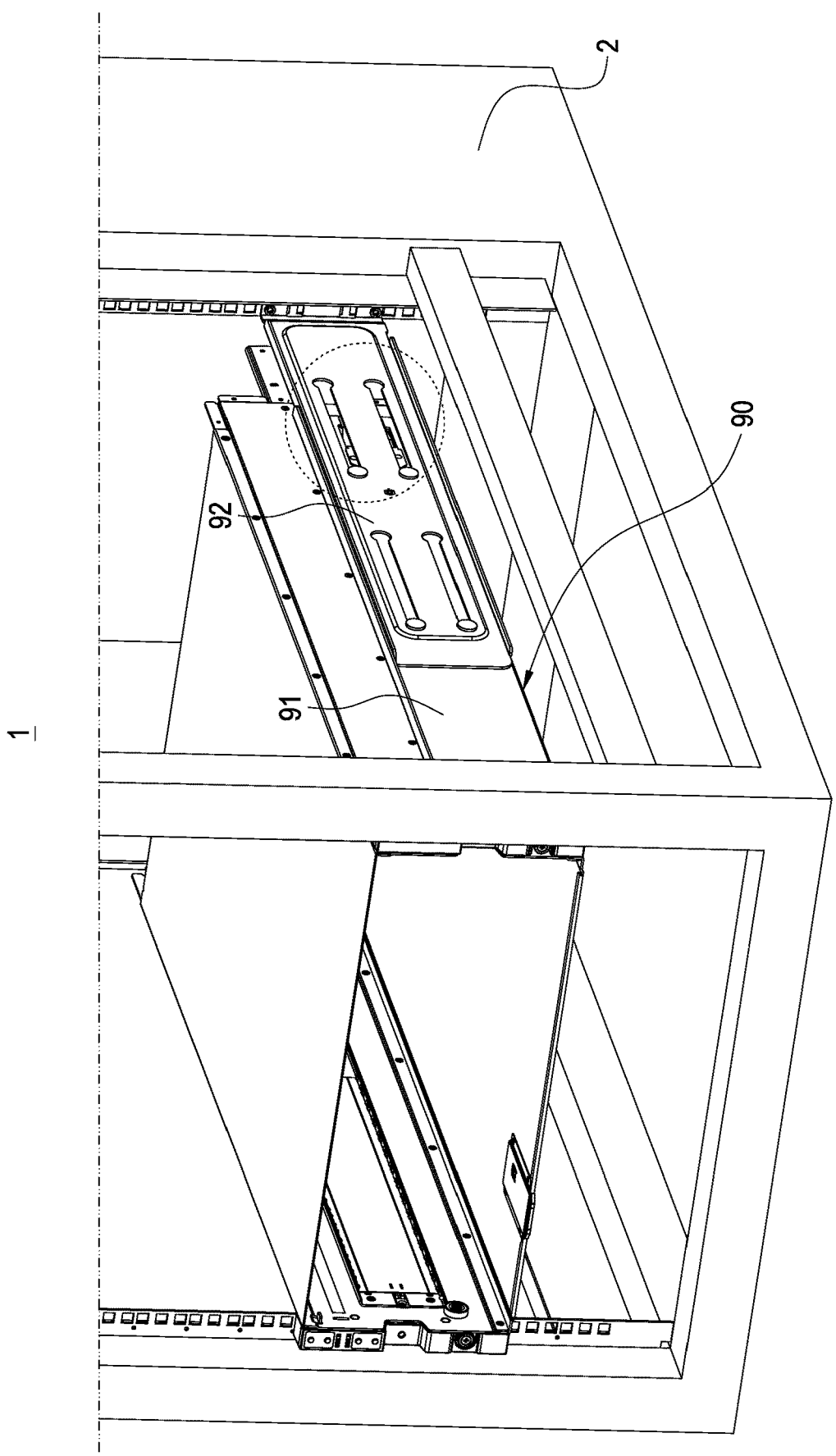

Please further refer to FIG. 12 and FIG. 13, which depict schematic views of application of the server chassis of the present invention. In one embodiment of the present invention, the server chassis 1 further includes a pair of supporting components 90. The pair of supporting components 90 are coupled to the cabinet 2 for supporting two sides of the server chassis 1. Each of the supporting components 90 includes a first supporting plate 91, a second supporting plate 92 and a latching piece 93. One side of the first supporting plate 91 and the second supporting plate 92 are fixed on the cabinet 2 separately, and the second supporting plate 92 is inserted in the first supporting plate 91. Additionally, the latching piece 93 is disposed between the first supporting plate 91 and second supporting plate 92. The latching piece 93 is provided for engaging with the outer shell 11 to support the server chassis 1.

Figure 14:
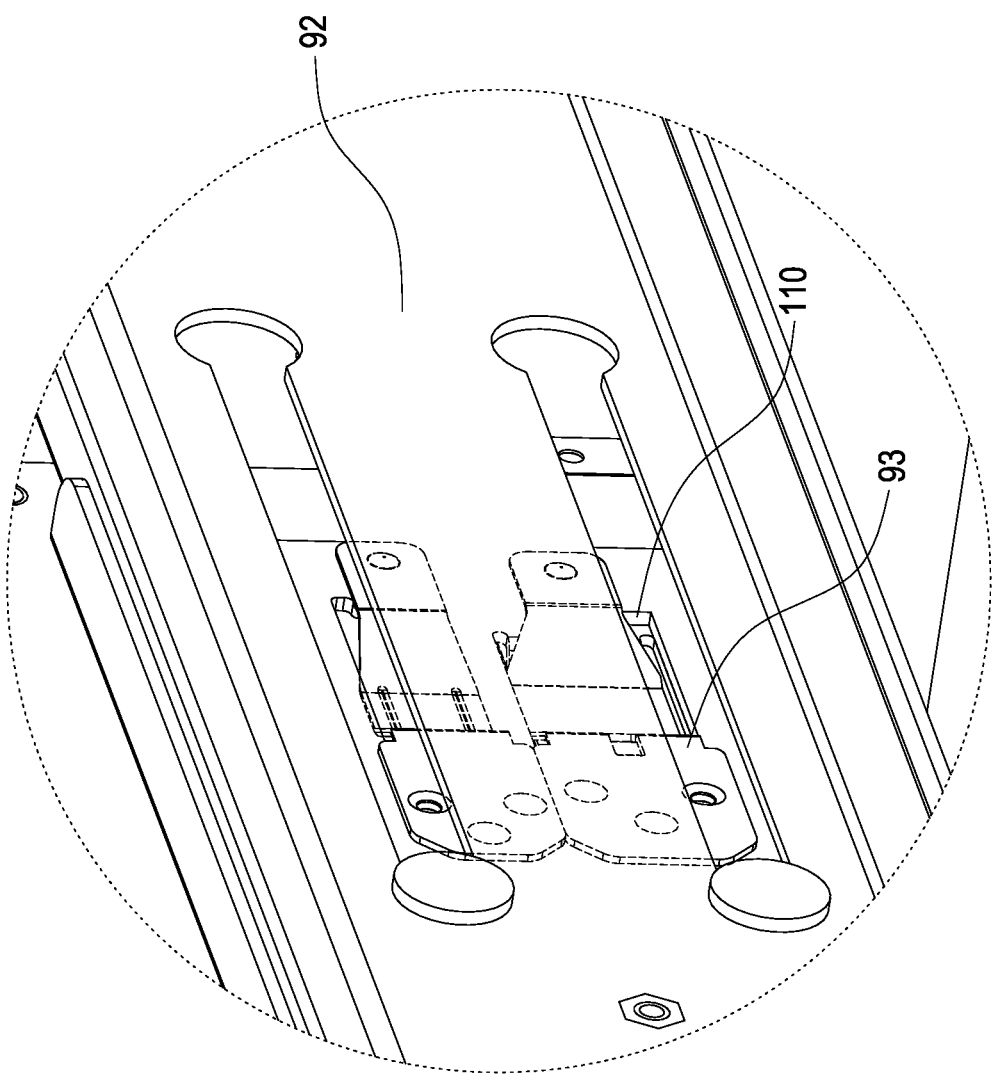
FIG. 14 is a partial enlarged schematic view of the supporting component of the present invention.
Figure 15:
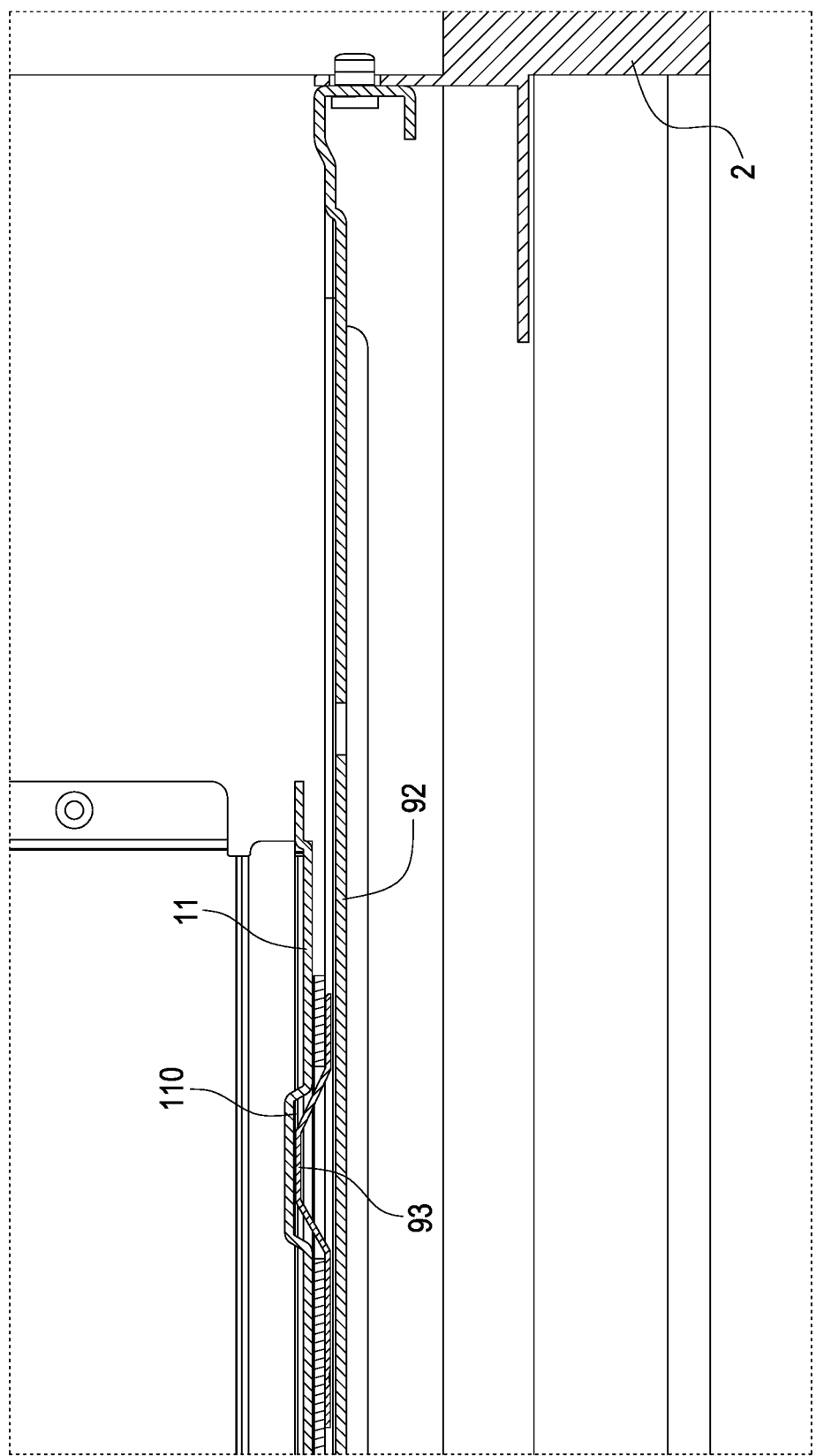
FIG. 15 is a partial cross-sectional schematic view of supporting component of the present invention.

Please further refer to FIG. 14 and FIG. 15, which depict a partial enlarged schematic view of the supporting component of the present invention and a partial cross-sectional schematic view of the supporting component of the present invention. In the present embodiment, the outer shell 11 has disposed a latching slot 110; besides, the cross section of the latch piece 93 is U-shaped. When the outer case 10 is coupled with the cabinet 2, the latching piece 93 of the supporting components 90 is inserted into the latching slot 110 for providing a supporting force.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A server chassis for combining with a cabinet, comprising:
    an outer case including a plurality of outer shells and an insertion space enclosed by the outer shells, and each of the outer shells having an inner wall facing the insertion space;
    a pair of outer rail structures disposed on the inner wall at opposite sides of the outer shells correspondingly, each of the outer rail structures including an outer rail-plate, a pair of outer-rails formed at two sides of the outer rail-plate and a set of ball slide rail, and the set of ball slide rail being a single-layer slide rail composed of a plurality of balls and extended from one end of the outer-rail to the other end;
    a chassis body slidably coupled to the insertion space, the chassis body including a plurality of inner shells and an accommodating space enclosed by the inner shells, and each of the inner shells having an outer wall at a place away from the accommodation space;
    a pair of inner rail structures disposed on the outer wall at opposite sides of the inner shells correspondingly, each of the inner rail structures including an inner rail-plate, and the chassis body being capable of sliding with respect to the outer case through the inner rail-plate inserted in the outer-rail correspondingly;
    a pair of handle structures, wherein the pair of the handle structures are disposed at opposite two sides of the chassis body,
    wherein each of the handle structures includes a handle, a pivot and a restricting member, and the handle is fixed on the outer wall of the inner shell through the pivot; the handle has a limiting slot, and the restricting member is arranged in the limiting slot;
    wherein the outer case further includes a stopper, and the stopper is disposed at the inner wall of the outer shell; the handle has a positioning slot at one side thereof, and the positioning slot is locked when the handle is rotated at a certain angle.

2. The server chassis according to claim 1, further including a supporting roller, wherein the supporting roller is abutted a side of the inner rail-plate.

3. The server chassis according to claim 1, wherein each of the handle structures further includes a fastener; the handle has a fastening hole, and the fastener is inserted in the fastening hole to fix the handle.

4. The server chassis according to claim 1, further including a plurality of positioning components, wherein the positioning components are disposed at the outer wall of the inner shell and are capable of being blocked by the stopper to position the chassis body.

5. The server chassis according to claim 4, wherein each of the positioning components includes a blocking arm, an elastic member, and a pivot shaft sleeved with the elastic member; one end of the blocking arm is coupled to the inner wall of the outer shell through the pivot shaft, and the blocking arm is provided with a buckle slot which can be locked by the stopper.

6. The server chassis according to claim 1, further including a pair of supporting components coupled to the cabinet, wherein each of the supporting components includes a first supporting plate, a second supporting plate and a latching piece; one side of the first supporting plate and the second supporting plate are fixed on the cabinet separately, and the second supporting plate is inserted in the first supporting plate; the latching piece is disposed between the first supporting plate and second supporting plate.

7. The server chassis according to claim 6, wherein the outer shell has disposed a latching slot, and the latching piece is latched in the latching slot.

\* \* \* \* \*